United States Patent [19]

Clark

[11] 4,062,243
[45] Dec. 13, 1977

[54] TUNER PINION GEAR GUIDE

[75] Inventor: Alfred James Clark, Palatine, Ill.

[73] Assignee: Motorola, Inc., Schaumburg, Ill.

[21] Appl. No.: 729,249

[22] Filed: Oct. 4, 1976

[51] Int. Cl.² .......................................... F16H 35/18
[52] U.S. Cl. ..................................... 74/10.8; 74/384; 334/7; 325/452
[58] Field of Search ...................... 325/452, 457, 352; 334/7, 41, 42, 43, 74; 74/10.8, 384

[56] References Cited

U.S. PATENT DOCUMENTS

| 3,634,791 | 1/1972 | Yasuda | 334/7 |
| 3,657,932 | 4/1972 | Walsh | 334/7 |
| 3,737,817 | 6/1973 | Ashida et al. | 334/7 |
| 3,906,806 | 9/1975 | Harlan | 74/10.8 |
| 3,947,786 | 3/1976 | Gordon | 334/7 |
| 3,964,320 | 6/1976 | Gordon | 334/7 |
| 4,011,513 | 3/1977 | Kawachi | 325/352 |

Primary Examiner—Robert L. Griffin
Assistant Examiner—Tommy P. Chin
Attorney, Agent, or Firm—Patrick T. King; James W. Gillman

[57] ABSTRACT

Radio tuner assembly with guide means for automatically maintaining the axis of the pinion gear in radial alignment with the crown gear on the tuner shaft. The tuner shaft is rotatably coupled to one end of the guide means. The pinion gear shaft is slidably and rotatably coupled to the other end of the guide means. The pinion gear shaft is coupled to a manual tuning control shaft through a universal joint connection. This arrangement provides a range of adjustable positions for the manual tuning control shaft relative to the radio tuner front panel while automatically maintaining the axis of the pinion gear in radial alignment with the crown gear.

7 Claims, 3 Drawing Figures

TUNER PINION GEAR GUIDE

BACKGROUND OF THE INVENTION

1. Field of the Invention

This invention relates generally to the field of pushbutton radio tuners with manual controls, and specifically to an improved manual tuning drive gear assembly with adjustable front panel positions.

2. Prior Art

In the prior art, various types of apparatus have been used to allow the front panel position of the tuning shaft control to be adjustable. Adjustment of the tuning control front panel position using these prior art methods usually resulted in the pinion gear, which was connected to the control shaft by a universal coupling, being misaligned with the crown gear being driven. This was due to the fact that the axis of the pinion gear was not in radial alignment with the crown gear. This misalignment of the gears caused cross-cutting and binding between the teeth of the pinion gear and the crown gear.

Some of the prior art attempted to solve the misalignment problem by having a bracket support the shaft to which the pinion gear was connected with the pinion gear shaft being adjustable over a range of positions. These brackets still did not maintain the axis of the pinion gear in radial alignment with the crown gear and involved use of a relatively complicated support bracket.

An improved assembly for adjusting the position of the control shaft while maintaining the axis of the pinion gear in radial alignment with the crown gear was described in the patent to Gordon, U.S. Pat. No. 3,964,320, patented June 22, 1976, assigned to the assignee of the present invention. That invention used a pinion gear support bracket which maintained the pinion gear in radial alignment with the crown gear. The support bracket in that patent must be manually adjusted for each desired position. It is advantageous to have the pinion gear automatically radially aligned with the crown gear no matter what position the control shaft is placed in on the front panel.

SUMMARY

It is an object of this invention to provide a simplified manual tuning assembly for a radio tuner.

It is a further object of this invention to provide a tuner drive assembly which automatically maintains the axis of the pinion gear in radial alignment with the crown gear over a range of adjustments on the front panel control shaft location.

It is a further object of this invention to provide a manual tuning control assembly for a radio which is economical to build and requires no adjustment to maintain radial alignment between the axis of the pinion gear and the crown gear.

It is another object of this invention to eliminate misalignment and consequential wear and binding between the pinion gear and the crown gear of a radio tuner assembly.

According to the present invention, the above objectives are achieved in a radio tuner assembly having tuning drive means adapted to operate the tuning means by either manual or pushbotton means. The tuning drive assembly has a drive shaft which is rotatably and slidably mounted on the front panel of the tuner support structure. The tuner control shaft contains a universal coupling which changes the angle of the axis of rotation of a first part of the tuning shaft with respect to the axis of rotation of a second part of the tuning shaft. A knob is fixed to the end of the first part of the tuning control shaft for manually rotating the shaft. A second shaft is rotatably mounted on the support structure and has a gear mounted to a portion of it. A second gear is fixed to the free end of the tuner control shaft. The second gear causes the first gear mounted on the tuner shaft to rotate. A guide is provided for acting in cooperation with the universal coupling on the tuner control shaft to position the axis of the second gear mounted on the tuner control shaft in radial alignment with the first gear mounted on the tuner shaft. One end of the guide means is rotatably coupled to the tuner shaft while the second end of the guide means is adapted to engage the tuner control shaft to permit rotational movement therebetween. A variable means is coupled to the tuner control shaft to accommodate variations in the lineal dimension along the tuner control shaft between the support structure and the tuner shaft.

BRIEF DESCRIPTION OF THE DRAWINGS

For a more complete understanding of the invention, reference should be made to the drawings in which.

DETAILED DESCRIPTION OF THE INVENTION

Figure 1:
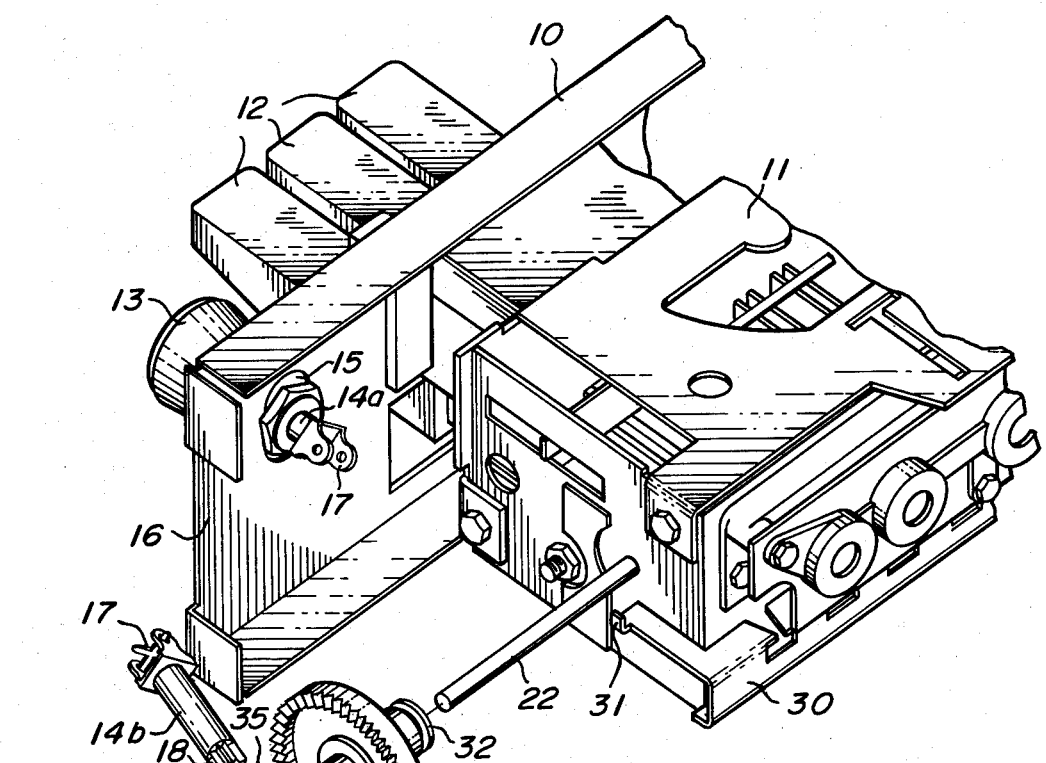
FIG. 1 is a perspective view of the radio support chassis and the tuner mechanism and a partial exploded perspective view of the manual tuning mechanism according to the invention.
Figure 2:
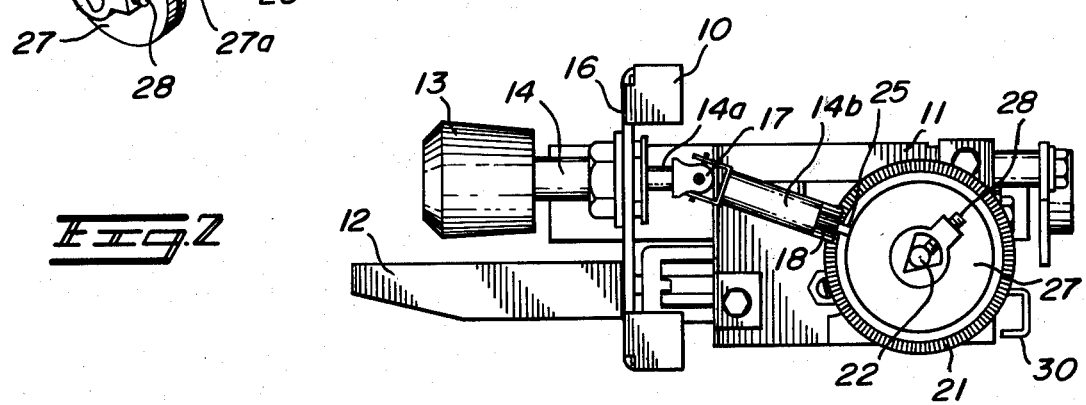
FIG. 2 is a side elevation view of the radio tuner and the tuning assembly of the invention showing the tuning control shaft and pinion gear in radial alignment with the crown gear.
Figure 3:
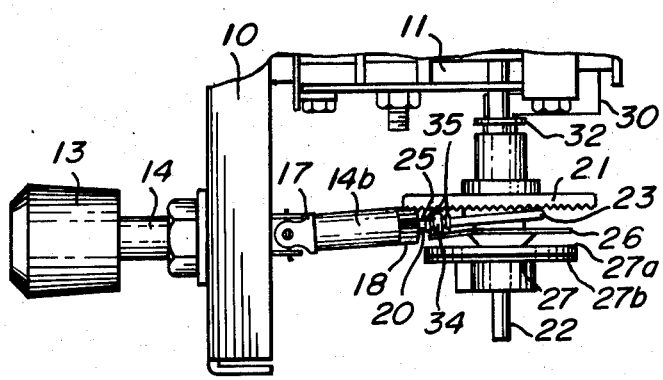
FIG. 3 is a partial plan view of the tuning assembly according to the invention.

Referring now more particularly to the drawings, a preferred embodiment is illustrated in FIGS. 1–3. FIG. 1 shows a perspective portion of a radio tuner assembly having a support structure 10 onto which is mounted a tuner 11. Either pushbuttons 12 or a manual tuning knob 13 are utilized by an operator to select a desired radio frequency. The manual tuning knob 13 is mounted on a first portion 14a of the first shaft 14 as shown in FIG. 2. The knob 13 allows rotation of the first shaft 14 when manual tuning is desired. Referring to FIG. 1, the first portion 14a of the first shaft 14 is slidably and rotatably mounted in an elongated opening 15 in a front portion 16 of the support structure 10. The position of the first shaft 14 can thus be adjusted with respect to the tuner 11 to accommodate various installation requirements. Means for supporting the first shaft 14 and fastening those support means to the first portion 16 of the support structure 10 are well-known in the art. The first portion 14a of the first shaft 14 is connected to a second portion 14b by a universal coupling 17 shown in FIG. 2. On the second portion 14b of the shaft is affixed a pinion gear 18. FIGS. 1 and 3 show a guide means 20 comprising a rod coupled to the second portion 14b of the first shaft 14. The rod provides support and guidance for the rotating second portion 14b of the first shaft 14. A crown gear 21 is coupled to a second shaft 22, the tuner shaft through a clutch 27. Rotation of the second shaft 22 provides frequency tuning for the tuner 11. A first end 23 of the guide means 20 rod made of spring wire is formed in a triangular shape so as to biasedly couple itself around a hub piece 24 of the crown gear 21. The first end 23 of the guide means 20 is thereby rotatably coupled to the second shaft 22. A second end 25 of the guide means rod 20 slidably and rotatably engages the second portion 14b of the first shaft 14. The pinion gear 18 teeth are maintained thereby in a radial alignment with the teeth of the crown gear 21. This is accomplished automatically and is independent of the position of the first portion 14a of the first shaft 14 on the front portion 16 of the support structure 10. A resilient disc 26 is coupled to the crown gear 21. The disc 26 resiliently contacts a roller 34. The roller 34 rotates about the axis of the guide means 20 rod and is held in position along the guide means 20 by swages 35 in the rod 20 on each side of the roller 34. The disc thereby biases the guide means rod as to maintain the teeth of pinion gear 18 in mesh with the teeth of crown gear 21. FIG. 3 shows a plain view of the tuner control assembly. An inner portion 27a of the clutch 27 is coupled to the crown gear 21 such that the crown gear 21, the resilient disc 26, and the inner portion 27a of the clutch rotate as a unit. An outer portion 27b of the clutch 27 is fixed to the shaft 22 with set screws 28. In the manual mode of operation the clutch inner portion 27a and the clutch outer portion 27b engage each other. The motion provided to the manual tuning knob is transmitted to the first shaft 14, to pinion gear 18, to the crown gear 21, and through the inner portion 27a of the clutch 27. When the clutch 27 is engaged, the motion is transmitted through the clutch 27 to the second shaft 22. The crown gear 21 merely rotates around the second shaft 22 and is not rigidly fixed to the shaft. Coupling of the crown gear 21 to the second shaft 22 is obtained when the clutch 27 is engaged. Lateral motion of the crown gear 21 along the shaft 22 is controlled by a movable portion 30 of tuner 11. A tab 31 on the movable portion 30 engages a shoulder 32 on the crown gear 21. When a pushbutton 12 is depressed, the moveable portion 30 of the tuner moves into the tuner (upward as shown in FIG. 3) and the tab 31 pulls the crown gear so that the clutch 27 opens, disengaging the manual tuning mechanism from the tuner shaft.

While the particular embodiment of the invention has been shown and described, it should be understood that the invention is not limited thereto since many modifications may be made. It is therefore contemplated to cover by the present application any and all such modifications that fall within the true spirit and scope of the basic underlying principles disclosed and claimed herein.

I claim:

1. A radio tuner assembly having a support structure, tuning means mounted on the support structure for selecting a desired station, and tuning drive means adapted to position the tuning means by manual and by pushbutton means, the tuning drive means comprising:

first shaft means rotatably and slidably mounted on the support structure, said shaft having a first portion, a second portion and a pivot means intermediate said first and second portion for coupling said portions together and providing means for changing the angle of the axis of rotation of the first portion relative to the axis of rotation of the second portion;

manual control means fixedly mounted on the first portion of the first shaft means for causing rotation thereof;

first gear means fixedly mounted on the free end of the second portion of the first shaft means for rotation therewith;

second shaft means rotatably mounted on the tuner structure;

second gear means mounted on a portion of the second shaft means;

the first gear means being adapted to cause rotation of the second gear means;

guide means having a first end coupled to the second shaft means to permit rotational movement therebetween and having a second end adapted to engage the second portion of the first shaft means to permit rotational movement therebetween, said guide means for cooperating with the pivot means of the first shaft means to position the axis of the second gear means in radial alignment with the first gear means; and variable means coupled to the first shaft means for accommodating variations in the lineal dimension measured along the first shaft means and the guide means to the axis of rotation of the second shaft means.

2. The assembly of claim 1 wherein the variable means comprises the second end of the guide means adapted to slidably engage the second portion of the first shaft means.

3. The assembly of claim 2 wherein the second end of the guide means comprises a rod slidably engaging the second portion of the first shaft means.

4. The assembly of claim 1 wherein the first end of the guide means comprises a rod predeterminedly formed to biasedly couple to the second shaft means.

5. The assembly of claim 1 further comprising means biasing the guide means for maintaining the first gear means in engagement with the second gear means.

6. The assembly of claim 1 wherein the variable means comprises the first gear means having a central bore end of the guide means being slidably received within said central bore.

7. A tuner for a radio receiver comprising:

a frame having a front wall with an aperture therein;

a crown gear;

a shaft rotatably supporting the crown gear in the frame;

adjustable tuning means including a tuning control shaft rotatably mounted in the aperture of the front wall of the frame and means for selectively positioning the control shaft in one of a plurality of fixed positions in the front wall;

pinion gear means carried by the tuning control shaft and cooperable with the crown gear for translating rotational movement of the control shaft to crown gear rotation for tuning to a desired frequency; and a control rod having one end journaled to the crown gear shaft and the other end slidably received within the pinion gear along its axis of rotation for maintaining the pinion gear axis in radial alignment with the crown gear for all selected positions of the control shaft while permitting relative rotational movement between the pinion gear and control rod.

* * * * *